(12) United States Patent
Sekine

(10) Patent No.: US 6,697,215 B2
(45) Date of Patent: Feb. 24, 2004

(54) INDEX SIGNAL OUTPUT DEVICE AND FLOPPY DISK DRIVE

(75) Inventor: Mikio Sekine, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 221 days.

(21) Appl. No.: 09/858,108

(22) Filed: May 15, 2001

(65) Prior Publication Data

US 2001/0053040 A1 Dec. 20, 2001

(30) Foreign Application Priority Data

May 26, 2000 (JP) ........................................ 2000-157303

(51) Int. Cl.$^7$ ................................................ G11B 17/02
(52) U.S. Cl. ................................................... 360/97.01
(58) Field of Search ............................ 360/97.01–99.12

(56) References Cited

U.S. PATENT DOCUMENTS 4,445,155 A * 4/1984 Takahashi et al. ........ 360/99.04
4,654,725 A     3/1987 Wakaizumi

FOREIGN PATENT DOCUMENTS

JP          60-162464          8/1985

* cited by examiner

*Primary Examiner*—Robert S. Tupper
(74) *Attorney, Agent, or Firm*—Brinks Hofer Gilson & Lione

(57) ABSTRACT

An index signal output device where a magnetic flux detector is moved in the direction of a relevant tangent to the circumference of a rotor yoke so that the phase difference between an index signal detected by the magnetic flux detector and an index reference signal previously recorded on a floppy disk is within a prescribed range. The lead terminals of the magnetic flux detector are connected to detection signal output terminals on a printed circuit board, and the magnetic flux detector is moved for adjustment in the direction of the tangent by flexing the lead terminals using a tool.

8 Claims, 4 Drawing Sheets

INDEX SIGNAL OUTPUT DEVICE AND FLOPPY DISK DRIVE

BACKGROUND OF THE INVENTION

1. Field of the Invention

This invention relates to an index signal output device that is used in a floppy disk drive or similar device.

2. Description of Related Art

A floppy disk drive (hereinafter referred to as an FDD) is mainly used as a device to drive a recording medium for a personal computer. It incorporates an index signal output device to detect the rotational position of the medium to initialize the recording medium or correct its writing or reading position. This index signal output device operates as follows: a magnet attached to the rotor yoke of the spindle motor as the component of the FDD generates a magnetic flux, which is detected by a magnetic flux detector located near, the rotor yoke such as a Hall IC to generate an index signal during spindle motor rotation.

If output of this index signal is not made at a correct time, data on the recording medium cannot be correctly reproduced and, in some cases, may be destroyed. For this reason, in the FDD, a mechanical or electrical adjustment (index adjustment) is made so that the phase difference between an index signal obtained as a result of detection by the magnetic flux detector, and an index signal previously recorded in the recording medium as a positional reference signal, is within a prescribed range. In this case, the mechanical adjustment takes place as follows: the detector detects a magnetic flux generated from the magnet attached to the rotor yoke of the spindle motor, and the detector, which issues an index signal according to this detection signal, is moved using a screwdriver or similar tool and then fixed with screws, etc. The electrical adjustment is performed, for example, by delaying an index signal sent from a magnetic flux detector such as a Hall element to a mono-multi circuit by a time constant which depends on the variable resistor and capacitor connected to the mono-multi circuit. Another proposed mechanical adjustment method is that a partially protruding metal member which guides a magnetic flux from the rotor magnet is continuously provided on the coil located opposite to the rotor yoke magnet and this metal member is moved horizontally around the outer circumference of the rotor yoke.

However, all these mechanical or electrical index signal adjustment methods have the practical problem that the index adjustment work is very troublesome or a complicated structure or circuit is required, leading to a high cost.

BRIEF SUMMARY OF THE INVENTION

This invention has been made in view of the above circumstances and provides an index signal output device which performs an index adjustment in a simple manner at low cost only by using the flexibility of the lead terminals of the magnetic flux detector, as well as an FDD which incorporates the same.

According to one aspect of this invention, an index signal output device has a magnet attached to a rotor yoke of a spindle motor, and a magnetic flux detector, located on the stator side opposite to the rotor yoke, which detects a magnetic flux generated by the magnet and issues an index signal, where the magnetic flux detector is movable or adjustable so that the phase difference between an index signal detected by the magnetic flux detector and an index reference signal previously recorded on a floppy disk is within a prescribed range. Here, the lead terminals of the magnetic flux detector are connected to detection signal output terminals on a printed circuit board, and the magnetic flux detector can be moved for adjustment in the direction of a relevant tangent to the outer circumference of the rotor yoke by flexing the lead terminals.

This makes it possible that, when the lead terminals of the magnetic flux detector are forced to be flexed and moved using a tool, in the direction of the relevant tangent to the outer circumference of the rotor yoke, the position for generating an index signal from the magnetic flux detector during the rotation of the magnet attached to the rotor yoke can be freely adjusted, thereby allowing this adjustment to be made easily at low cost without the need for a complicated structure or circuit.

According to another aspect of this invention, the index signal output device has a carrier printed wiring board (PWB) for supporting the lead terminals of the magnetic flux detector around the ends of the detector, where the carrier PWB can be moved in the abovementioned tangent direction with respect to a printed circuit board by taking full advantage of the flexibility of the lead terminals.

This makes it possible that the carrier PWB is moved by a given distance to a given position in the abovementioned tangent direction without causing the lead terminals to break at the ends of the magnetic flux detector and without extremely bending part of the lead terminals.

According to another aspect of this invention, the printed circuit board in the index signal output device has a slit which guides the carrier PWB inserted therein in the abovementioned tangent direction.

This makes it possible that the magnetic flux detector, held by the carrier PWB, is moved correctly in the abovementioned tangent direction, and an index signal is issued accurately depending on the amount of movement.

According to another aspect of this invention, in the index signal output device, the lead terminals of the magnetic flux detector are passed through-holes in the carrier PWB and thus supported.

This makes it possible that the lead terminals are supported stably around the ends of the magnetic flux detector with ease and reliability.

According to another aspect of this invention, in the index signal output device, the lead terminals of the magnetic flux detector are soldered to the conductor lands formed around the openings of the through-holes in the carrier PWB.

This makes it possible that even when the carrier PWB is moved for adjustment, the lead terminals are not squeezed at their connections (joints) with the magnetic flux detector and thus the connections are strong enough and reliable.

According to another aspect of this invention, the printed circuit board in the index signal output device has a slit which guides the carrier PWB inserted therein in the abovementioned tangent direction, and the carrier PWB, at its area above the top surface of the printed circuit board, has through-holes perpendicular to the slit through which the lead terminals are passed.

This prevents the carrier PWB from falling off the slit and enables it to move smoothly in the abovementioned tangent direction along the printed circuit board.

According to another aspect of this invention, the index signal output device uses an inductor as a magnetic flux detector.

This makes it possible that even when the magnetic flux detector is moved away from the outer circumference of the rotor yoke by some distance for adjusting the position of the carrier PWB, it can detect magnetic fluxes with a higher sensitivity than another type of detector such as a Hall element.

According to another aspect of this invention, the FDD has an index signal output device which can freely adjust the index signal issuing position at low cost with ease, eliminating the need for using a complicated structure or circuit.

BRIEF DESCRIPTION OF DRAWINGS

Preferred embodiments of this invention will be described in detail based on the followings, wherein.

DETAILED DESCRIPTION OF THE PREFERRED EMBODIMENTS

Figure 1:
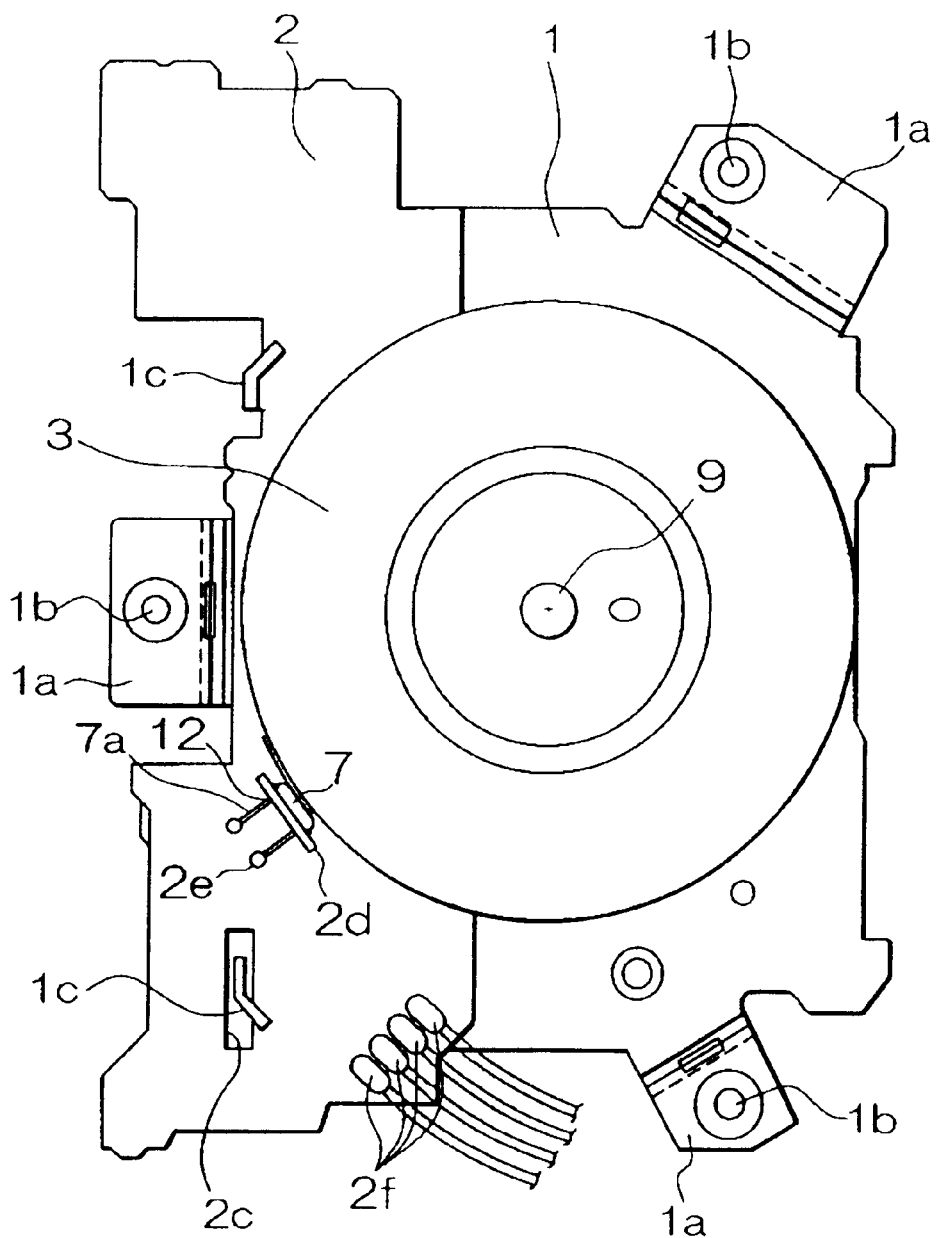
FIG. 1 is a top view illustrating an FDD according to an embodiment of this invention.
Figure 2:
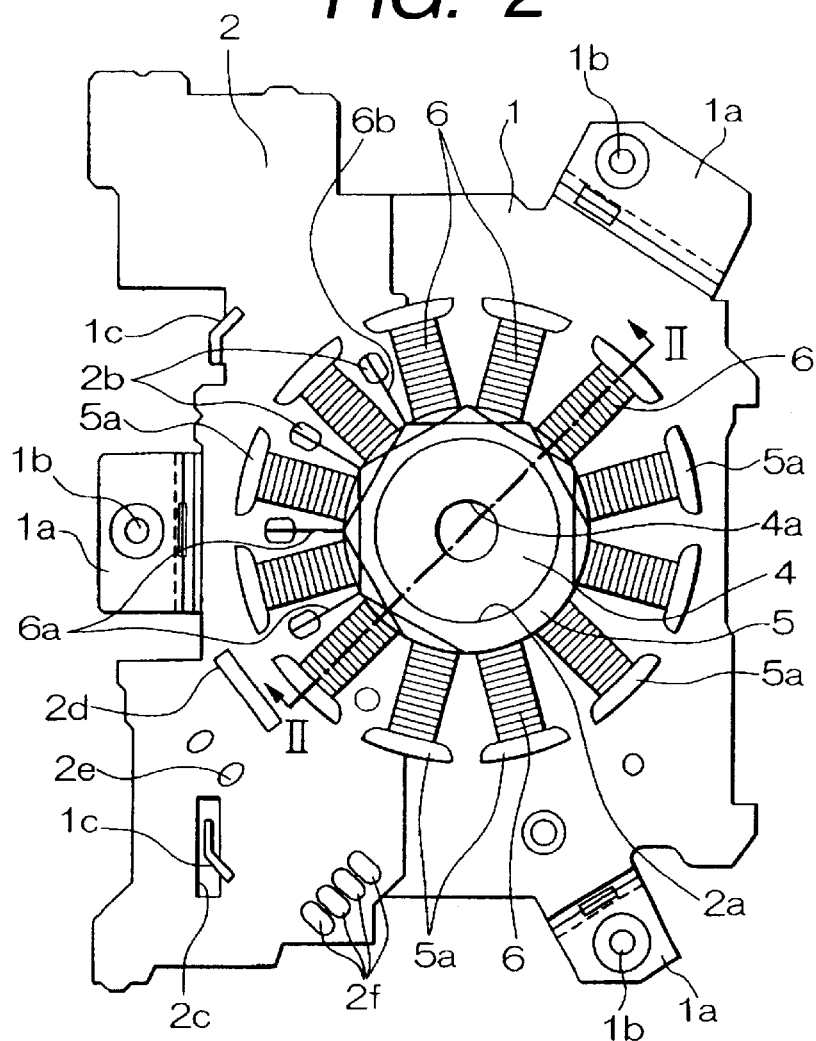
FIG. 2 is a top view illustrating the stator in the FDD shown in FIG. 1.
Figure 3:
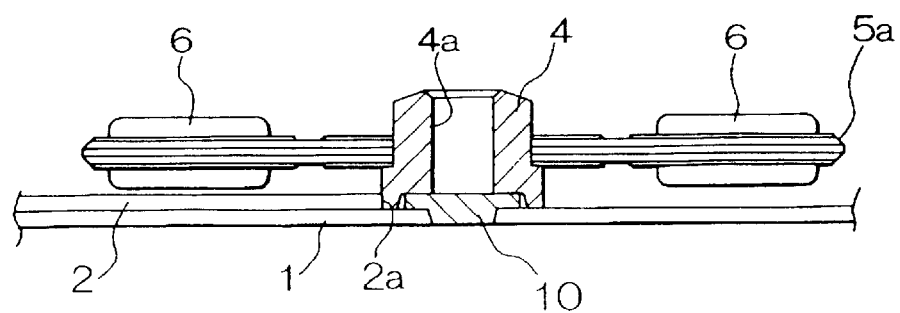
FIG. 3 is a sectional view taken substantially along the line II—II of FIG. 2.

Next, preferred embodiments of this invention will be described in detail. FIGS. 1 and 3 conceptually illustrate part of the FDD which has a spindle motor according to this invention. The spindle motor has a printed circuit board 2 superimposed on a reinforcing plate 1 and a rotor yoke 3. The reinforcing plate 1 as a metal mount consists of a metal plate, on the periphery of which are three integral tabs 1a to be bent like the letter L. These tabs 1a each have a hole 1b for fixing the reinforcing plate 1 onto a floppy disk drive case or something like that with screws or other fasteners. In addition, at other four places on the periphery of the reinforcing plate 1 are virtually L-shaped chucking claws 1c which are standing upright. These claws 1c hold the following points on the printed circuit board 2 superimposed on the reinforcing plate 1 by pressure from above: one point is on the circuit board periphery and the other is part of the periphery of a through-hole 2c in the printed circuit board 2. Application of this pressure is achieved by bending part of each of the claws 1c horizontally in a dog-legged manner using a tool, as shown in FIG. 1.

The printed circuit board 2 consists of an insulating substrate which bears a wiring pattern and components for the spindle motor drive circuit and drive control circuit and so on (not shown in the figures); it is mounted on the side of the reinforcing plate 1 where an inductor (stated later) is to be installed and occupies only less than one half of the surface area of the reinforcing plate 1. In a side face of the printed circuit board 2 is a bearing notch 2a in which a bearing 4 with a shaft hole 4a, which is attached to the reinforcing plate 1, stands protruding upward. On the outer circumference of this protruding bearing 4 is a core 5 having twelve magnetic poles 5a spaced at regular intervals. A stator coil 6 is wound around each of the magnetic poles 5a. These stator coils 6 constitute three sets of coils for three phases U, V and W. The coil terminals 6a for these three phase coils and one common coil terminal 6b are soldered to the lands 2b on the printed circuit board 2.

As shown in FIG. 3, the core 5 consists of a layered core made by laying a plurality of punched silicon steel plates one on top of another. Also, the printed circuit board 2 has a slit 2d opposite to one of the magnetic poles 5a, through which a carrier PWB 10 (stated later) bearing an inductor 7 for detecting the index position for a recording medium is movably inserted. On the printed circuit board 2 are also lands 2e for soldering the lead terminals 7a of the inductor 7. In one corner of the printed circuit board 2 are four lands 2f for connecting external leads, which are connected to the lands 2b through the wiring pattern on the circuit board 2.

A shaft 9 is passed through the center hole of the rotor yoke 3; the lower half of the shaft 9 can be inserted into the shaft hole 4a of the bearing 4. In this condition, the rotor yoke 3 is arranged on the printed circuit board 2 so as to cover the stator coils 6 and an inductor 7 is facing or opposite to the outer circumference of the flange 3a, as shown in FIG. 1. In addition, a thrust bearing 10 is fitted into the bottom of the shaft hole 4a of the bearing 4 and the lower end of the shaft 9 is supported by this thrust bearing 10. Therefore, the shaft 9 can rotate smoothly while being supported by the shaft hole 4a and the thrust bearing 10. A chuck or similar device is fitted on the rotor yoke 3 so that the center hub (not shown) of a floppy disk can rest on it and be held in place by it.

Figure 4:
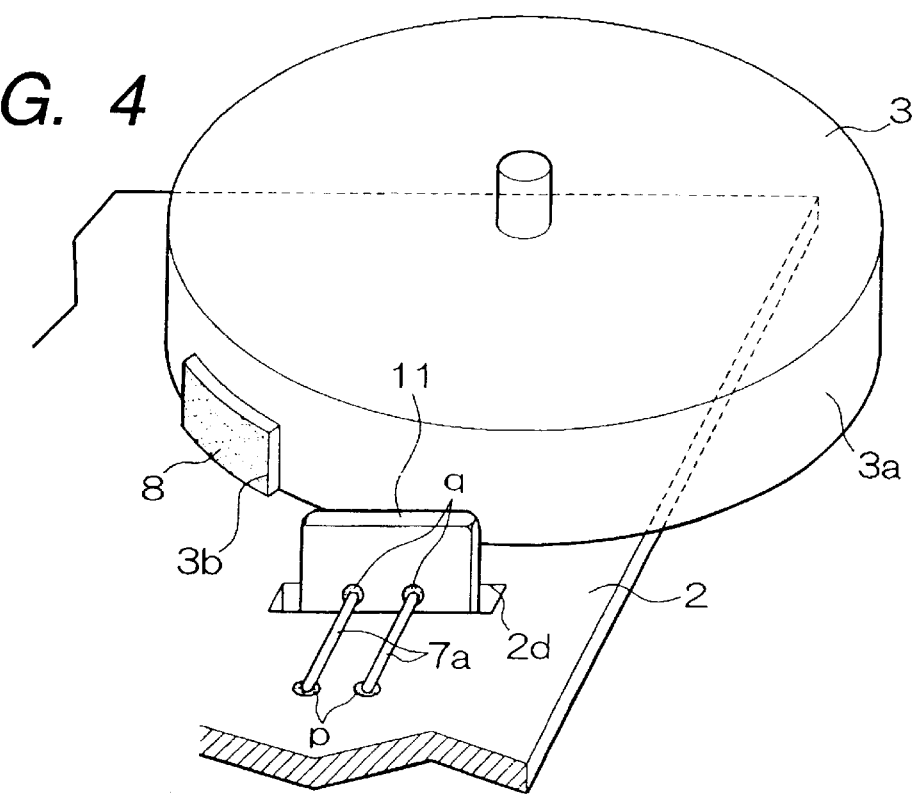
FIG. 4 is a perspective view illustrating the detailed structure of an index signal output device according to one embodiment of this invention.
Figure 5:
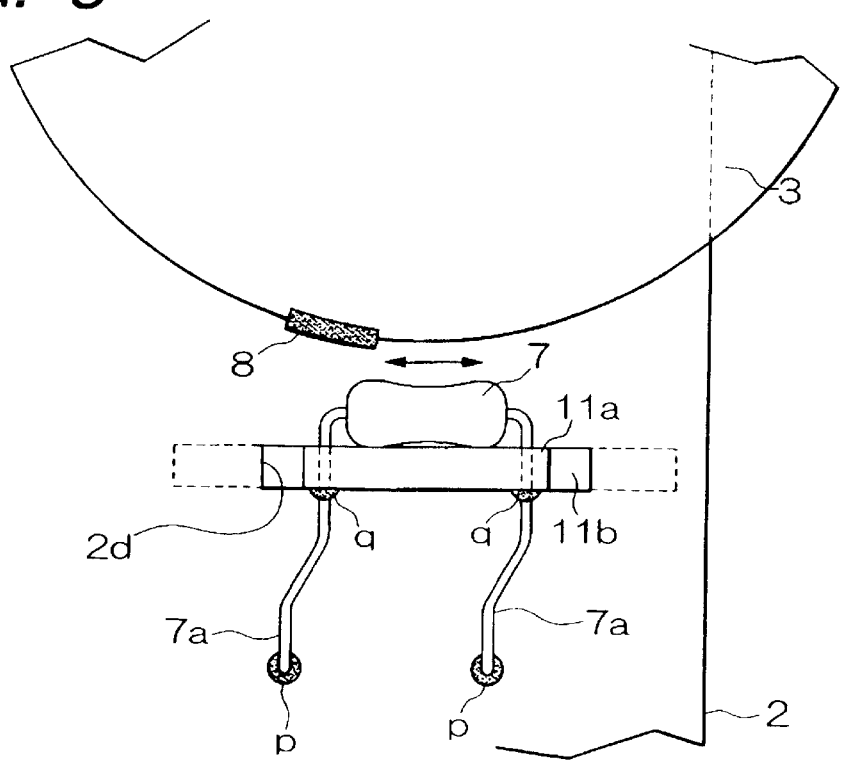
FIG. 5 is a top view illustrating the FDD shown in FIG. 4.
Figure 6:
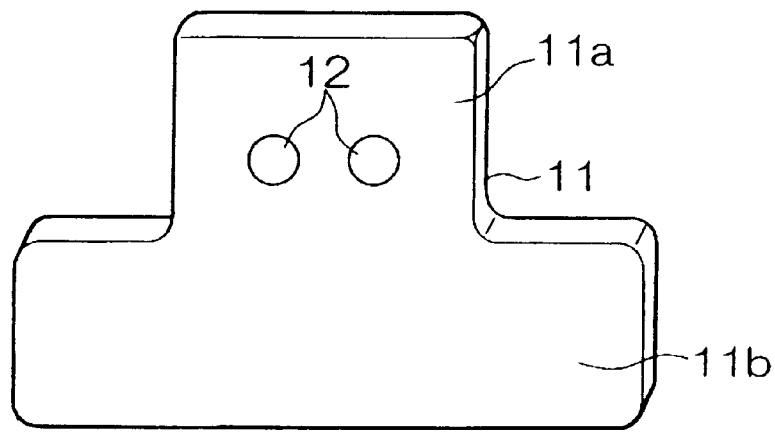
FIG. 6 is a perspective view illustrating the carrier PWB shown in FIG. 4.

FIG. 4 and FIG. 5 are a perspective view and a top view, respectively, illustrating part of the index signal output device in the FDD conceptually. In this index signal output device, the rotor yoke 3 of the spindle motor is rotatably placed on the printed circuit board 2 which is superimposed on the top surface of the metal mount (not shown). On the printed circuit board 2 are a wiring pattern and components for the spindle motor drive circuit; arranged in a circle under the rotor yoke 3 are plural magnetic poles 5a around which plural sets of said three-phase stator coils 6 are wound. Attached on the rear of the rotor yoke 3 are a ring of rotor magnets which are magnetized as N and S poles alternately. Therefore, when a three-phase alternating current is supplied to the stator coils 6 with phase changes in a predetermined order, a magnetic repulsive force is generated between the rotor magnets and the coils, which causes the rotor yoke 3 to rotate on the stator. A magnet 8 for detecting an index signal is fitted into the notch 3b in the flange 3a of the rotor yoke 3 in a way that it protrudes partially.

Facing the outer circumference of the rotor yoke 3 is the abovementioned slit 2d in the direction of a relevant tangent to the outer circumference of the rotor yoke 3. This slit 2d has a specific width which allows a carrier PWB (stated later) partially inserted therein to slide. Numeral 11 in the figure represents the carrier PWB whose overall shape is like a flattened letter T upside down. The upper smaller part 11a of the carrier PWB is inserted through the slit 2d from below the printed circuit board 2 with its top portion protruding upward from the printed circuit board 2. The lower larger part 11b of the carrier PWB 11 is longer than the overall length of the slit 2d so that it cannot pass through the slit upwards.

Figure 7:
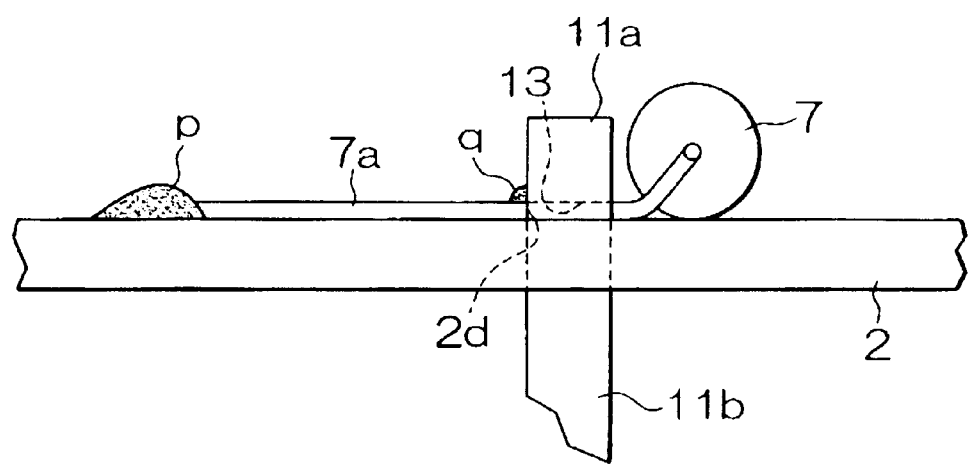
FIG. 7 is a side view illustrating how the inductor is held in place according to an embodiment of this invention.

The carrier PWB's upper smaller part 11a which is inserted in the slit 2d, protruding upward from the printed circuit board 2, has two through-holes 12. As shown in FIG. 5, the two lead terminals 7a of an inductor 7 as a magnetic flux detector are passed through these through-holes 12 and supported by them around the ends of the inductor 7. Therefore, the printed circuit board 2 lies between the lead terminals 7a of the inductor 7 and the top edge of the lower larger part 11b of the carrier PWB 11, as shown in FIG. 7, so the lead terminals 7a prevent the upper smaller part 11a from falling off through the slit 2d. The inductor 7 is positioned on the carrier PWB 11 facing the outer circumference of the rotor yoke 3. The ends of the two lead terminals 7a of the inductor 7 are soldered (p) on the terminals (lands) of the printed circuit board 2. Formed around the through-holes 12 of the carrier PWB 11 are conductor lands (q), to which parts of the lead terminals 7a passed through the through-holes 12 are soldered.

In this configuration of the index signal output device, as the rotor yoke 3 of the spindle motor rotates, the magnet 8 rotates as well; when the rotating magnet 8 comes nearest to the inductor 7, the latter detects a magnetic flux from the former and issues an index signal according to the rotational speed of the rotor yoke 3 at a prescribed timing. The carrier PWB 11 is moved in the direction of the relevant tangent to the rotor yoke 3 inside the slit 9 using a tool so that the phase difference between the index signal thus detected by the inductor 7 and the index signal previously recorded on the floppy disk is within a prescribed range. In this way, an index signal phase adjustment is made to ensure that data is recorded on a floppy disk or reproduced correctly.

This index adjustment is carried out by flexing the lead terminals 7a of the inductor 7 supported by the carrier PWB 11 forcedly, so the mechanism for holding and moving the inductor 7 is simple and less costly. Further, as the carrier PWB 11 is moved along and inside the slit 2d, the inductor 7 is guided in the abovementioned tangent direction (parallel to the relevant tangent) accurately and thus the amount of movement and the amount of index adjustment always match each other accurately, permitting a highly accurate index adjustment. In the abovementioned case, the lead terminals 7a of the inductor 7 are passed through and supported by the through-holes 12 bored in the carrier PWB 11; however, the same effect can be obtained by using notches to support them instead of the through-holes 12. In addition, an index adjustment according to this invention does not necessarily require through-holes 12 or notches which support the lead terminals 7a of the inductor 7, because the inductor 7 is located on an extension of a radial line from the center of the yoke to the outer circumference of the rotor yoke 3 to ensure high output power, and, for adjustment, moved in the direction parallel to the relevant tangent while the lead terminals 7a are being forcedly flexed. Generally, this kind of adjustment should be made only once during a pre-shipment test. So, while the inductor 7 is being moved in the abovementioned tangent direction using a tool, the lead terminals 7a are flexed before finally being fixed. While the rotor yoke 3 is rotating, the inductor 7 detects not only a magnetic flux with high accuracy from the magnet 8 but also a sub-peak signal; this sub-peak signal can be removed by a known masking circuit.

Because the carrier PWB 11 supports the lead terminals 7a around the ends of the inductor 7, the inductor 7 can be moved in the abovementioned tangent direction by a sufficiently large stroke which takes full advantage of the lead terminal length. In addition, by guiding the carrier PWB 11 along and inside the slit, the inductor 7 can be moved accurately in the direction of the relevant tangent to the outer circumference of the rotor yoke 3. Also, by soldering the lead terminals 7a from the inductor 7 onto the conductor lands on the carrier PWB 11, an excessive stress on the connections between the lead terminals 7a and inductor 7 can be prevented while the lead terminals 7a are being flexed. The carrier PWB 11 is fixed to the slit 2d by gluing or soldering, or with screws.

Since the lead terminals 7a of the inductor 7 as a magnetic flux detector are passed through the slit 2d perpendicularly to the carrier PWB 11, the carrier PWB 11 can be smoothly moved in the abovementioned tangent direction along the slit 2d with no possibility of falling off the slit 2d. As the magnetic flux detector, a Hall IC or the like may be used instead of the inductor 7.

As discussed so far, this invention brings about the following effects. One effect is that the lead terminals of the magnetic flux detector are connected to the detection signal output terminal on the printed circuit board, and the magnetic flux detector can be moved for adjustment in the direction of the relevant tangent to the rotor yoke while the lead terminals are being flexed using a tool, thereby allowing an index adjustment to be made easily at low cost just by taking full advantage of the flexibility of the lead terminals of the magnetic flux detector.

Another effect of the invention is that, since the carrier PWB is movable in the abovementioned tangent direction with respect to the printed circuit board due to the flexibility of the lead terminals, it can be moved by a given distance to a given position in the abovementioned tangent direction without causing the lead terminals to break at the ends of the magnetic flux detector and without bending hard some part of the lead terminals. Also, since the printed circuit board has a slit which guides the carrier PWB inserted therein, in the abovementioned tangent direction, the magnetic flux detector held by the carrier PWB, can be moved correctly in the abovementioned tangent direction, and an index signal is accurately detected according to the amount of movement.

A further effect of the invention is that, since the lead terminals of the magnetic flux detector are passed through-holes in the carrier PWB and thus supported, the lead terminals are supported stably around the ends of the magnetic flux detector with ease and reliability. Furthermore, the lead terminals of the magnetic flux detector are soldered to the conductor lands formed around the openings of the through-holes in the carrier PWB, so the lead terminals are not squeezed at their connections (joints) with the magnetic flux detector and thus the connections are strong enough and reliable.

An further effect of the invention is that, since the printed circuit board has a slit which guides the carrier PWB inserted therein in the abovementioned tangent direction and the carrier PWB, at its area above the top surface of the printed circuit board, has through-holes perpendicular to the slit, through which the lead terminals are passed, the carrier PWB is prevented from falling off the slit, and can be moved smoothly in the abovementioned tangent direction along the printed circuit board. In addition, since the index signal output device uses a general-purpose inductor as the magnetic flux detector, even when the magnetic flux detector is moved away from the outer circumference of the rotor yoke for adjusting the position of the carrier PWB, it can detect magnetic fluxes with a higher sensitivity than another type of detector such as a Hall element.

What is claimed is:

1. An index signal output device comprising:
   a magnet attached to a rotor yoke of a spindle motor; and
   a magnetic flux detector, located on the stator side opposite to the rotor yoke, which detects a magnetic flux generated by the magnet and issues an index signal,
   a carrier printed wiring board for supporting lead terminals of the magnetic flux detector around the ends of the magnetic flux detector,
   wherein the position of the magnetic flux detector is adjustable so that the phase difference between an index signal detected by the magnetic flux detector and an index reference signal previously recorded on a floppy disk is within a prescribed range, wherein the carrier printed wiring board is fitted in a slit formed in a printed circuit board so as to be guided in a direction of a relevant tangent to the outer circumference of the rotor yoke, wherein a portion of the carrier printed wiring board facing the top surface of the printed circuit board through the slit has through-holes perpendicular to the slit, through which the lead terminals of the magnetic flux detector extend, and wherein the lead terminals of the magnetic flux detector extending through the through-holes of the carrier printed wiring board are connected to detection signal output terminals on the printed circuit board, and the position of the magnetic flux detector is adjusted by flexing the lead terminals to move the magnetic flux detector in the tangent direction.

2. The index signal output device according to claim 1, wherein the lead terminals of the magnetic flux detector are soldered to the conductor lands formed around the openings of the through-holes in the carrier PWB.

3. The index signal output device according to claim 1, wherein an inductor is used as the magnetic flux detector.

4. A floppy disk drive having the signal output device according to claim 1, wherein the index signal output device further comprises a carrier PWB for supporting the lead terminals of the magnetic flux detector around the ends of the detector, and the carrier PWB can be moved in the abovementioned tangent direction with respect to the printed circuit board by taking full advantage of the flexibility of the lead terminals.

5. The floppy disk drive according to claim 4, wherein, in the index signal output device, the printed circuit board of the index signal output device has a slit which guides the carrier PWB inserted therein in the abovementioned tangent direction.

6. The floppy disk drive according to claim 4, wherein, in the index signal output device, the lead terminals of the magnetic flux detector are passed through through-holes in the carrier PWB and thus supported.

7. The floppy disk drive according to claim 4, wherein, in the index signal output device, the lead terminals of the magnetic flux detector are soldered to the conductor lands formed around the openings of the through-holes in the carrier PWB.

8. The floppy disk drive according to claim 4, wherein, in the index signal output device, the printed circuit board has a slit which guides the carrier PWB inserted therein in the abovementioned tangent direction and the carrier PWB, at its area above the top surface of the printed circuit board, has through-holes perpendicular to the slit, through which the lead terminals are passed.

* * * * *